United States Patent [19]
David

[11] Patent Number: 5,635,870
[45] Date of Patent: Jun. 3, 1997

[54] EFFICIENT AMPLIFICATION TECHNIQUES FOR NON-LINEAR AMPLIFIERS

[76] Inventor: Michael David, 5177 Don Pio Dr., Woodland Hills, Calif. 91364

[21] Appl. No.: 515,523

[22] Filed: Aug. 15, 1995

[51] Int. Cl.$^6$ ............................................. H03F 3/66
[52] U.S. Cl. ............................................. 330/52; 455/70
[58] Field of Search ........................... 330/52, 107, 149; 455/69, 70, 126

[56] References Cited

U.S. PATENT DOCUMENTS 5,313,657   5/1994   Sakamoto et al. ................. 330/52 X

FOREIGN PATENT DOCUMENTS 022621   11/1985   Japan ........................... 455/70
9423491  10/1994   WIPO .

OTHER PUBLICATIONS

H. Krauss, C. Bostian and F. Raab, *Solid State Radio Engineering* (J. Wiley & Sons 1980), pp. 348–371, 394–468, 472–473.

J. Millman, *Microelectronics: Digital and Analog Circuits and Systems* (McGraw–Hill 1979), pp. 660–673.

J. Pierce and T. Paulus, *Applied Electronics* (Bell & Howell 1972), pp. 597–624.

Product Specification for SD4010 RF and Microwave Transistor, published by SGS–Thomson Microelectronics (1992).

*Primary Examiner*—Steven Mottola

[57] ABSTRACT

A method and apparatus is provided for amplifying electronic signals in a linear fashion while maintaining DC power efficiency. In one embodiment, the invention comprises a coupler receiving an input signal and connected to a non-linear amplifier. A tone generator is also connected to the coupler, and generates a tone signal at a selected frequency. The coupler combines the tone signal and an input signal and provides the combined signal to the amplifier. The combined signal is amplified and bandpass filtered to remove spectral by-products. The power of the tone wave generator signal is selected so as to cause the nonlinear amplifier to operate near its saturation point but in a linear region. The effect is to linearize the operation of the non-linear amplifier, while simultaneously minimizing the presence of intermods and maintaining a relatively high level of DC power efficiency. Various modifications are also disclosed, wherein the amplitude of the tone signal is adjusted according to the power level of the input and/or output signal.

19 Claims, 17 Drawing Sheets

CLASS A

CLASS AB

CLASS C

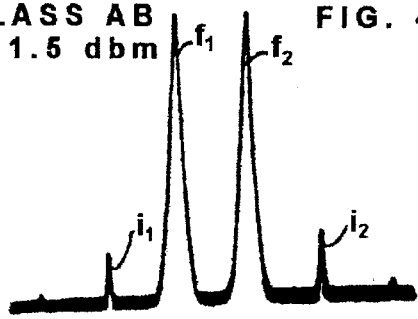
FIG. 4A CLASS AB +21.5 dbm
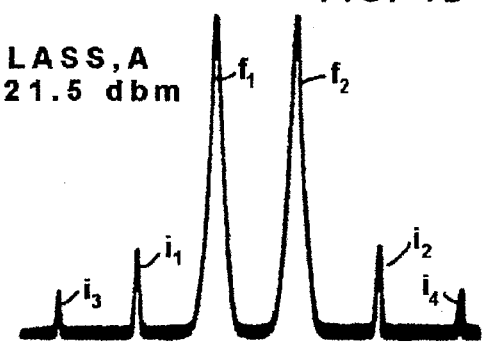
FIG. 4D CLASS, A +21.5 dbm
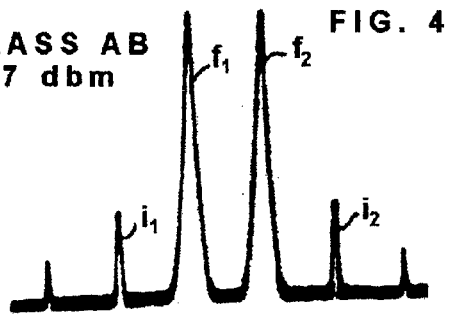
FIG. 4B CLASS AB +17 dbm
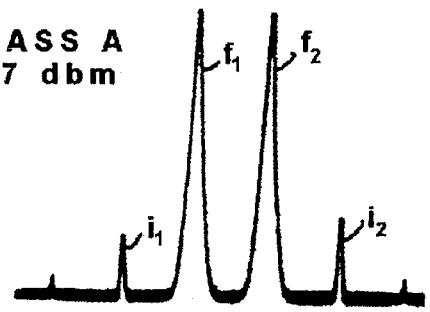
FIG. 4E CLASS A +17 dbm
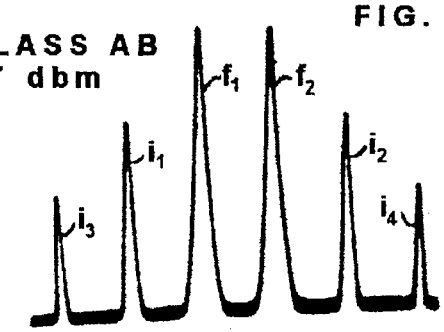
FIG. 4C CLASS AB +7 dbm
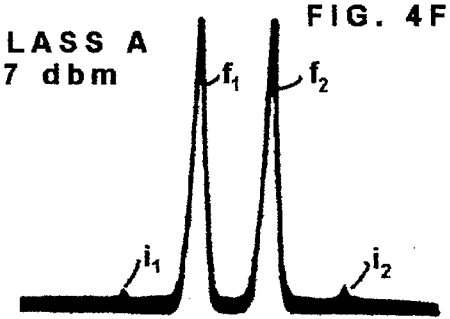
FIG. 4F CLASS A +7 dbm

EFFICIENT AMPLIFICATION TECHNIQUES FOR NON-LINEAR AMPLIFIERS

FIELD OF INVENTION

The field of the present invention relates to a method and apparatus for efficient amplification of electronic signals.

BACKGROUND OF THE INVENTION

Various devices are known for amplifying electronic signals. Such devices are commonly divided into at least three basic groups known as class A amplifiers, class AB amplifiers, and class C amplifiers. Class A amplifiers may generally be described as linear, while class AB and class C amplifiers may generally be described as nonlinear.

Linear, or class A, amplifiers have an advantage of providing an output signal which varies predictably in a linear fashion from the input signal. Nonlinear amplifiers, in contrast, provide an amplification level which is not uniform over their input range. Because of their uniform gain characteristics, linear or class A amplifiers are preferred for many applications, e.g., certain types of transmitters or receivers in the field of communications (including television).

In addition, linear or class A amplifiers generally have favorable power efficiency with respect to amplification of AC signals, and are superior to nonlinear amplifiers, such as class AB and class C amplifiers, in this regard.

Despite some of the advantages of linear amplifiers, one drawback with using linear amplifiers is their relatively large DC power consumption, particularly when compared to the DC power consumption of nonlinear amplifiers such as class AB and class C nonlinear amplifiers. One reason for the relatively large DC power consumption is that class A amplifiers tend to draw significant DC power even in the absence of an AC input signal. In contrast, nonlinear amplifiers tend to draw no DC power or minimal DC power in the absence of an AC input signal.

In order to keep DC power consumption to a minimum, it would be desirable to use nonlinear amplifiers such as class AB and class C amplifiers for applications normally requiring linear amplification characteristics. To do so, it is often necessary to try to linearize the performance of the nonlinear amplifier, e.g., by utilizing a specific linear region of the operating range of a nonlinear amplifier.

For example, in one particular technique, a DC bias signal is used as a means to force the nonlinear amplifier to operate in a linear region of its operating range. An exemplary conventional system configured with a bias signal is shown in FIG. 12, which is a circuit diagram of an SD4010 silicon NPN planar transistor manufactured by SGS-Thomson Microelectronics and using diffused emitter ballast resistors. The FIG. 12 circuit includes a non-linear amplifier 1215 coupled to a bias signal 1210, a purpose of which is to attempt to linearize the performance of the non-linear amplifier 1215.

One drawback of using a DC bias signal 1210 such as shown in FIG. 12 is that determination of a suitable DC bias level ordinarily necessitates a tedious process of trial and error. Moreover, even after arriving at a suitable DC bias level, operation of the nonlinear amplifier is not made completely linear. Rather, variations in the amplitude of the input signal beyond a certain level will generally result in nonlinear operation. In addition, the energy of the bias signal in combination with the input signal power may cause burn out of the amplifier 1215.

In another conventional technique for linearizing nonlinear amplifier operation, a class A pre-amplifier stage is used to boost the input signal level such that the input signal falls within the linear region of the nonlinear amplifier. The combination of class A and class AB amplifier, because of the nonlinear amplification stage, is commonly categorized as a class AB amplifier. A drawback of this technique is that it is necessary to tightly control the level of the output signal from the class A pre-amplifier, which may be difficult.

In addition to the difficulty in getting a nonlinear class AB or class C amplifier to behave in a linear fashion, nonlinear amplifiers in operation often suffer from the creation of undesired signal by-products. Third-order signal by-products (called intermods) are created when two or more input signals, or signal components at different frequencies of an input signal, are amplified. In non-linear amplifiers, the intermods grow in amplitude relative to the output signal as the input signal weakens. Thus, if the input signal is relatively low, then the undesired intermods may approach the same amplitude as the desired output signal. Linear amplifiers, in contrast, have third-order intermods that vary proportionately with the input signal. Thus, as the input signal weakens, the undesired intermods decrease in magnitude proportionately to the decrease in the output signal.

It would be advantageous to provide an amplifier having linear amplification characteristics resembling that of a linear amplifier, such as a class A amplifier, while at the same time having the DC power efficiency of a nonlinear amplifier, such as a class AB or class C amplifier. It would further be advantageous to provide such an amplifier capable of rejecting or minimizing the effect of undesired spectral by-products such as intermods.

SUMMARY OF INVENTION

A method and apparatus is provided for amplifying electronic signals in a linear fashion while maintaining DC power efficiency. In one embodiment, the invention comprises a nonlinear amplifier having a tone generator coupled by a coupler to an input of the amplifier. The tone generator generates a signal such as a sine wave at a selected frequency. The coupler mixes the signal from the tone wave generator with the desired input signal. The power of the tone wave generator signal is selected so as to cause the nonlinear amplifier to operate near its saturation point but in a linear region. The effect is to linearize the operation of the nonlinear amplifier, while simultaneously reducing the effect of intermods and providing an output signal that varies linearly with the input signal. Because a nonlinear amplifier is used in the preferred embodiment, a relatively high level of DC efficiency is achieved.

In other embodiments of the invention, feedback is used for adjusting the characteristics (e.g., amplitude) of the local oscillator.

BRIEF DESCRIPTION OF THE DRAWINGS

The various objects, features and advantages of the present invention may be better understood by examining the Detailed Description of the Preferred Embodiments found below, together with the appended figures, wherein:

FIGS. 4A–4F are graphs comparing the presence of intermods in signals amplified with a class A and a class AB amplifier, respectively.

DETAILED DESCRIPTION OF THE PREFERRED EMBODIMENTS

The invention will now be described in its preferred embodiments with reference to the accompanying drawings.

Figure 1A:
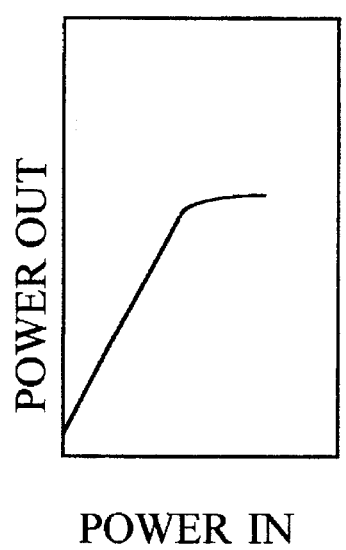
FIGS. 1A–1C are graphs showing a general comparison of power characteristics of a class A amplifier, a class AB amplifier, and a class C amplifier.
Figure 1B:
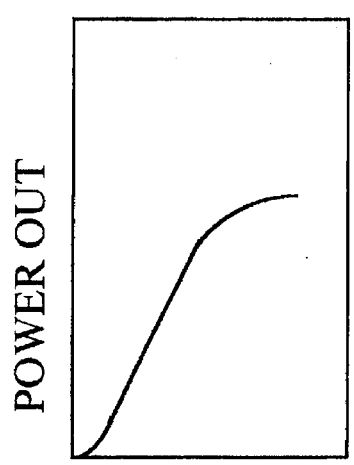
Figure 1C:
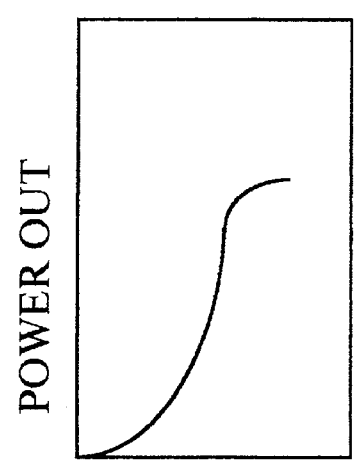
Figure 2A:
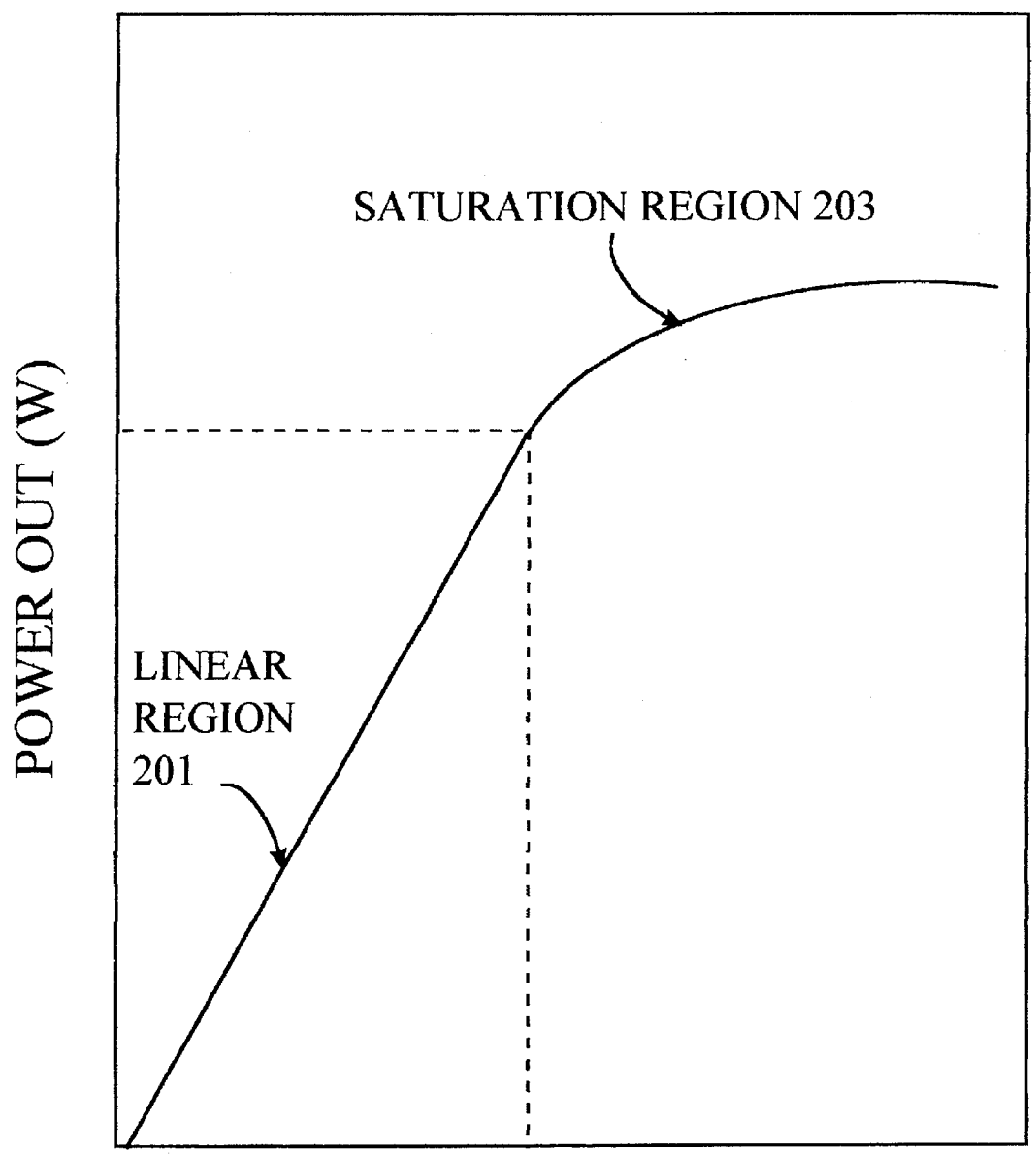
FIG. 2A is a more detailed graph of input-output power characteristics of a class A amplifier.

FIGS. 1A–1C are graphs showing a comparison of power characteristics of a class A amplifier, a class AB amplifier, and a class C amplifier. FIG. 1A is a graph showing an input-output power characteristics of a class A amplifier, which graph is shown in more detail in FIG. 2A. The graph of FIG. 2A is generally divided into a linear region 201 and a saturation region 203. In the linear region 201, output signals are generally amplified in fixed proportion to the input signal, while in the saturation region 203 little or no additional increase in output amplitude or power results from an increase in the input power.

Figure 2B:
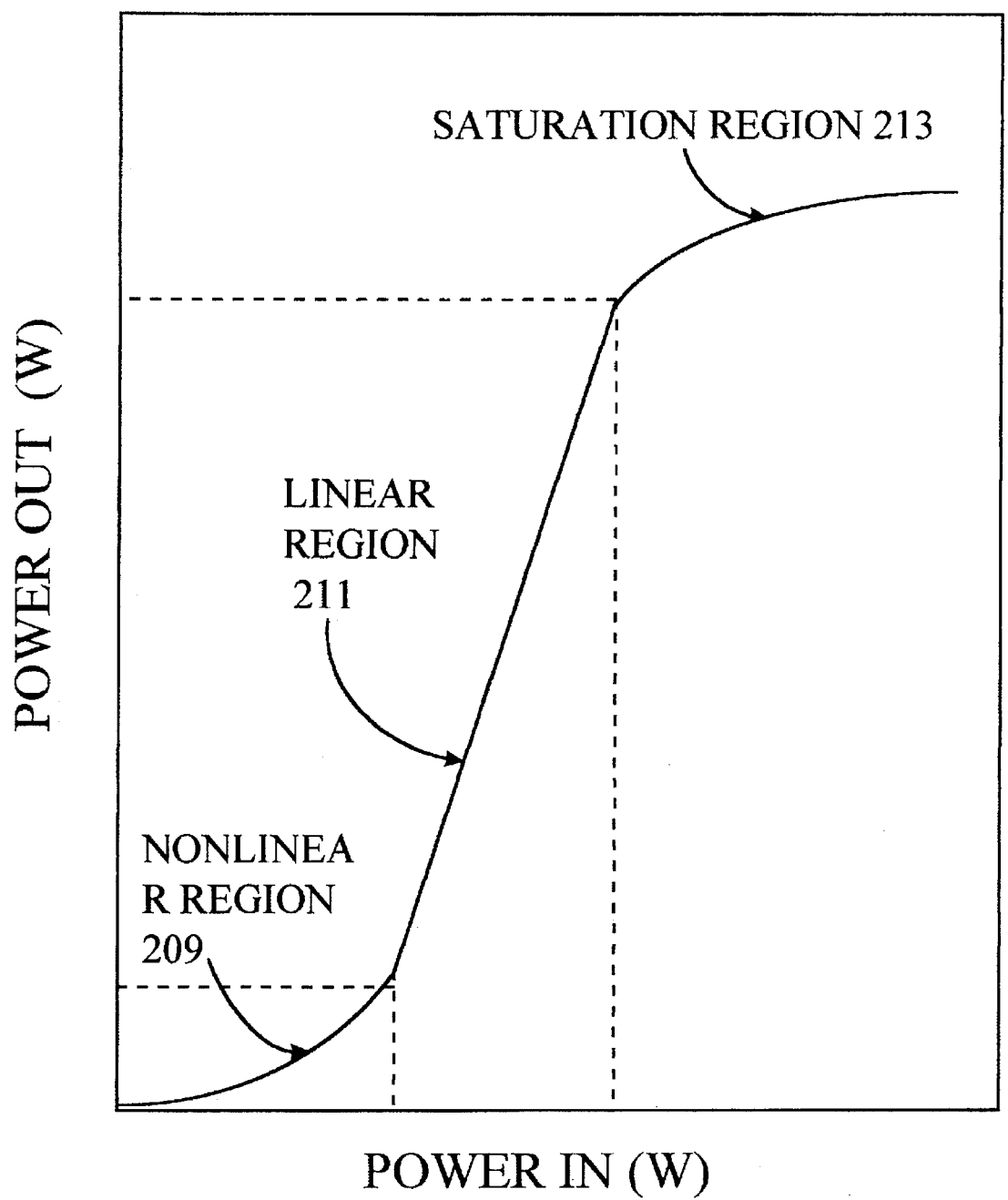
FIG. 2B is a more detailed graph of input-output power characteristics of a class AB amplifier.

FIG. 1B is a graph showing the input-output characteristics of a class AB amplifier, which graph is shown in more detail in FIG. 2B. The FIG. 2B graph is generally divided into a non-linear region 209, a linear region 211, and a saturation region 213. In the linear region 211, output signals are generally amplified in fixed proportion to the input signal, similar to the class A amplifier. In the saturation region 213, an increase in input power results in little or no additional increase in output amplitude or power, similar to the class A amplifier. The graph of FIG. 2B has a non-linear region 209 preceding the linear region 211, wherein input signals are amplified by a varying amount according to the shape of the input-output characteristic shown in the FIG. 2B graph. Operation in the non-linear region tends to be less efficient from a power standpoint than operation in the linear region. Further, operation in the non-linear region is undesirable because of the unpredictable or varying amount of change in amplitude or power of the output signal for a given change in the input signal.

As noted, class A amplifiers tend to be less efficient than nonlinear amplifiers in terms of DC power consumption. For example, a comparison of power efficiency for an exemplary class A amplifier and an exemplary class C amplifier is explained below with reference to Table 2-1 and Table 2-2.

TABLE 2-1

| Class | D.C. Power | RF Power Out | Efficiency |
|-------|------------|--------------|------------|
| A     | 100 W      | 40 W         | 40%        |
| C     | 100 W      | 40 W         | 40%        |

In the example shown in Table 2-1, a class A amplifier and a class C amplifier each draw 100 watts of DC power, and each generate a signal having 40 watts of output power, resulting in a 40% efficiency rating. In Table 2-2 below, it is assumed that the input power from Table 2-1 is cut in half, and the output power measured with the same class A and class C amplifiers.

TABLE 2-2

| Class | D.C. Power | RF Power Out | Efficiency |
|-------|------------|--------------|------------|
| A     | 100 W      | 20 W         | 20%        |
| C     | 50 W       | 20 W         | 40%        |

In the example of Table 2-2, while the class A amplifier continues to draw 100 watts of DC power, the class C amplifier draws only 50 watts of DC power, or half of the power it was drawing as compared to the situation of Table 2-1. Both the class A and the class C amplifiers generate a signal with 20 watts output power, or half that of the output signal of Table 2-1. While the class C amplifier continues to have an efficiency rating of 40%, the class A amplifier efficiency drops to 20% because of its larger DC power consumption. Accordingly, it would be beneficial to provide an amplifier having an efficiency similar to a nonlinear amplifier such as a class C or class AB amplifier.

Figure 3:
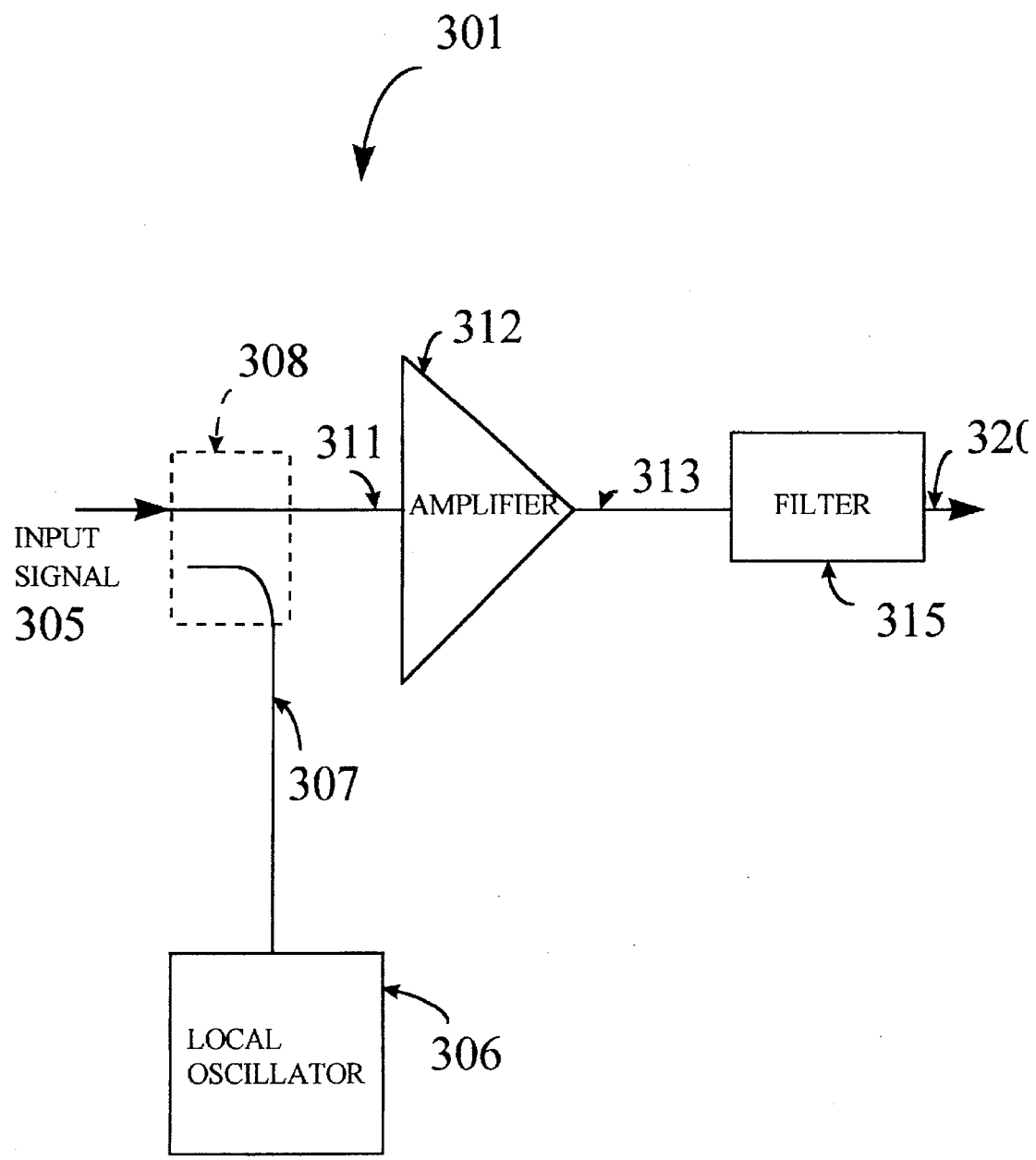
FIG. 3 is a block diagram of a preferred embodiment of an amplification system in accordance with one or more aspects of the present invention.

FIG. 3 is a block diagram of a preferred embodiment of an amplification system in accordance with one or more aspects of the present invention.

The amplification system of FIG. 3 comprises an amplifier 312, a tone generator 306, a coupler 308, and a bandpass filter 315. An input signal 305 to be amplified is provided to the coupler 308. The tone generator 306, which may be embodied as a local oscillator, is also connected to the coupler 308. The coupler 308 combines the input signal 305 with a tone output signal 307 from the tone generator 306 and produces a biased input signal 311. The biased input signal is connected to the amplifier 312, which amplifies the biased input signal 311 and generates an amplified signal 313. The amplified signal is coupled to the bandpass filter 315, which filters the amplified signal 313 and generates an output signal 320.

The input signal 305 is preferably a time-varying signal, and may be, for example, an RF signal to be sent over a communication channel. Amplifier 312 is preferably a non-linear amplifier, such as a class AB amplifier. An input signal 305 may be comprised of a plurality of frequency components. The following explanation considers two frequency components (or tones) located at frequencies f1 and f2, respectively, in the input signal 305. However, operation of the various amplifier configurations may be extrapolated for input signals comprising more than two frequency tones by assuming that any two tones of a multi-tone signal, within the same general context, will produce similar results. Consequently, if an amplifier has relatively poor performance for two exemplary input tone signals, it may be assumed that it will have poor performance for a general multi-tone input signal over the input signal bandwidth. Conversely, if an amplifier has relatively superior performance for two exemplary input tone signals, it may be assumed that it will have superior performance for a general multi-tone input signal over the input signal bandwidth.

Without considering operation of the coupler 308 and the tone generator 306, for a input signal 305 comprising two tones, the amplifier 312 may output a two-tone signal such as shown in any of FIGS. 4A–4C. FIGS. 4A–4C are graphs showing input signals of varying strength amplified by a class AB amplifier. FIG. 4A is a frequency diagram showing two frequency components, or tones 401 and 402, located at frequencies f1 and f2. The FIG. 4A diagram shows an amplified signal level of +21.5 dBm. Third order intermodulation distortion in the amplifier 312 typically results in the presence of undesired "tones" i1 and i2 called third order intermods. One third order intermod i1 appears at a frequency 2f1–f2, while another third order intermod i2 appears at a frequency 2f2–f1. These third order intermods i1 and i2 may appear relatively close to the tones f1 and f2, and therefore may be difficult to effectively filter out even with a bandpass filter.

FIGS. 4B and 4C show the effect of the output tones as the output signal strength decreases. FIG. 4B shows an amplified signal level +17 dBm. The FIG. 4B graph shows two tones at frequencies f1 and f2, as in FIG. 4A, and also third order intermods i1 and i2 similar to FIG. 4A. However, the amplitude of the third order intermods i1 and i2 with respect to the two primary tones at frequencies f1 and f2 is larger in FIG. 4B than in FIG. 4A. FIG. 4C is a frequency graph showing an amplified signal level of +7 dBm. The FIG. 4C graph shows that, for an input signal with less gain, the relative size of the third order intermods i1 and i2 has increased even more over the graph of FIG. 4B. Further, higher order intermods i3 and i4, less prominent in FIGS. 4A and 4B, have significantly grown in the FIG. 4C graph.

FIGS. 4A–4C may be contrasted with FIGS. 4D–4F, which show signals of similar strength but amplified by a class A amplifier. FIG. 4D is a graph showing an amplified signal level of +21.5 dBm, and may be compared against the FIG. 4A graph corresponding to the class AB amplifier. The third order intermods i1 and i2 in FIG. 4D are not substantially larger than the third order intermods i1 and i2 shown in FIG. 4A. FIG. 4E is a graph showing an amplified signal level of +17 dBm, and may be compared against the FIG. 4B graph. While the third order intermods i1 and i2 in FIG. 4B are not substantially larger than the third order intermods i1 and i2 shown in FIG. 4D, it may be noted that the third order intermods i1 and i2 have surpassed the magnitude of those for the class A amplifier. FIG. 4F is a graph showing an amplified signal level of +7 dBm, and may be compared against the FIG. 4C graph. While the third order intermods i1 and i2 have shrunk to barely noticeable in the FIG. 4F graph, the third order intermods i1 and i2 in the FIG. 4C graph are unacceptably large. Further, the FIG. 4C graph has an undesired growth of higher order intermods such as i3 and i4.

The large relative growth of third order intermods i1 and i2, as well as higher order spectral by-products such as intermods i3 and i4, when the output signal power is reduced in the class AB amplifier (such as, e.g., when operating in the non-linear region 209 as shown in FIG. 2B) makes it important to prevent operation of a class AB amplifier under conditions where the output signal power is relatively low.

The amplification system of FIG. 3 modifies operation of the amplifier 312 such that the third order intermods i1 and i2 are substantially suppressed. In the FIG. 3 system, the tone generator 306 generates a signal 307, such as a sine wave, at a predetermined frequency $f_B$. The predetermined frequency $f_B$ is preferably relatively close to a center frequency $f_0$ of the input signal 305 and within the operating bandwidth of the amplifier 312, but far enough away from the input signal center frequency $f_0$ so as not to interfere with the operational bandwidth of the amplifier 312. The predetermined frequency $f_B$ is preferably outside of the bandwidth defined by the third order intermods i1 and i2. The amplitude of the signal 307 should be roughly equal to the amplitudes of the two tones at frequencies f1 and f2, or slightly less (e.g., 3 dB less).

As an example, assume that the two tones have frequencies at f1=875 MHz, and f2=880 MHz, respectively. Third order intermods should therefore appear at frequencies of i1=2f1–f2=870 MHz, and i2=2f2–f1=885 MHz. The predetermined frequency $f_B$ should preferably be selected outside of range 870 MHz to 885 MHz, yet relatively close to f1 and f2 and within the operating range of the amplifier 312; thus, the predetermined frequency $f_B$ may be selected, for example, at a frequency such as 842 MHz.

Figure 6A:
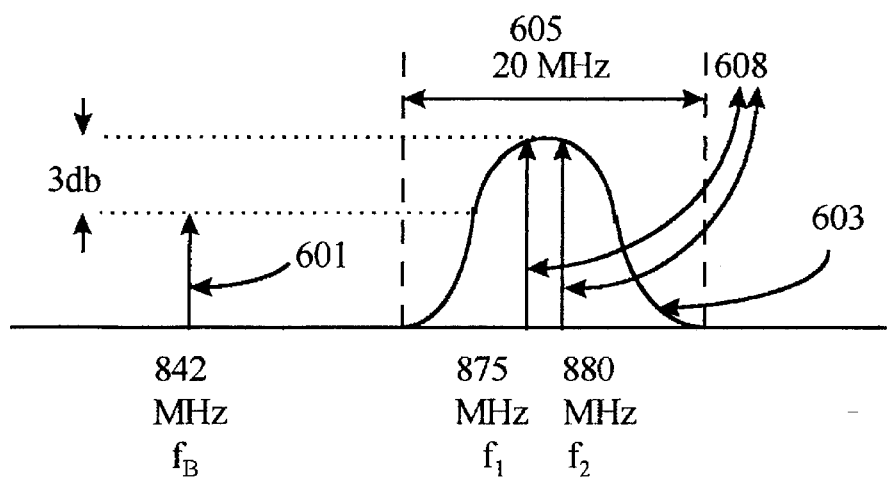
FIGS. 6A and 6B are exemplary frequency diagrams showing sample input and output frequencies for a particular amplification system in accordance with the FIG. 3 embodiment.

This process results in the creation of higher order spectral by-products. Such spectral by-products may be expected, for example, at frequencies iB1=2f2–$f_B$, and iB2=2f1–$f_B$, as may be explained, for example, with reference to the frequency diagrams of FIGS. 6A and 6B. FIG. 6A is a graph showing an input signal 603 centered at a frequency of 877.5 MHz and having an input bandwidth 605 of 20 MHz. FIG. 6A also shows a tone signal 601 generated by the tone generator 306. The input signal 603 may comprise multiple frequency components (or tones); for purpose of explanation, two frequency components 608 at frequencies f1 and f2 are considered. Behavior for more than two frequency components (or frequency components at different frequencies of the input signal 603 than those shown), may be extrapolated from the analysis of the frequency components 608 shown.

Figure 6B:
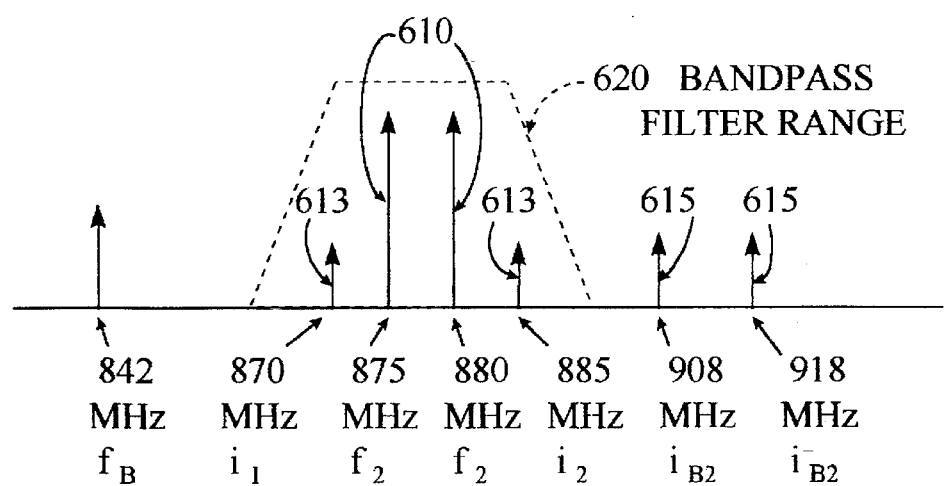

FIG. 6B is a graph showing two tones 610 output from amplifier 312 at frequencies f1 and f2, along with third order intermods 613 at frequencies i1 and i2 as described above resulting from the amplification of frequency components 608. FIG. 6B also shows spectral by-products 615 at frequencies iB1 and iB2 (i.e., 908 MHz and 918 MHz in the present example). These by-products may be filtered out by bandpass filter 315. Bandpass filter 315 is preferably configured so as to allow frequencies around f1 and f2 to pass through, and has a sufficient bandwidth to allow the amplified information to pass through, but attenuates signals in the range of 2f1–$f_B$ and higher. Accordingly, bandpass filter 315 may have a filtering bandwidth 620 such as shown in FIG. 6B.

Figure 5A:
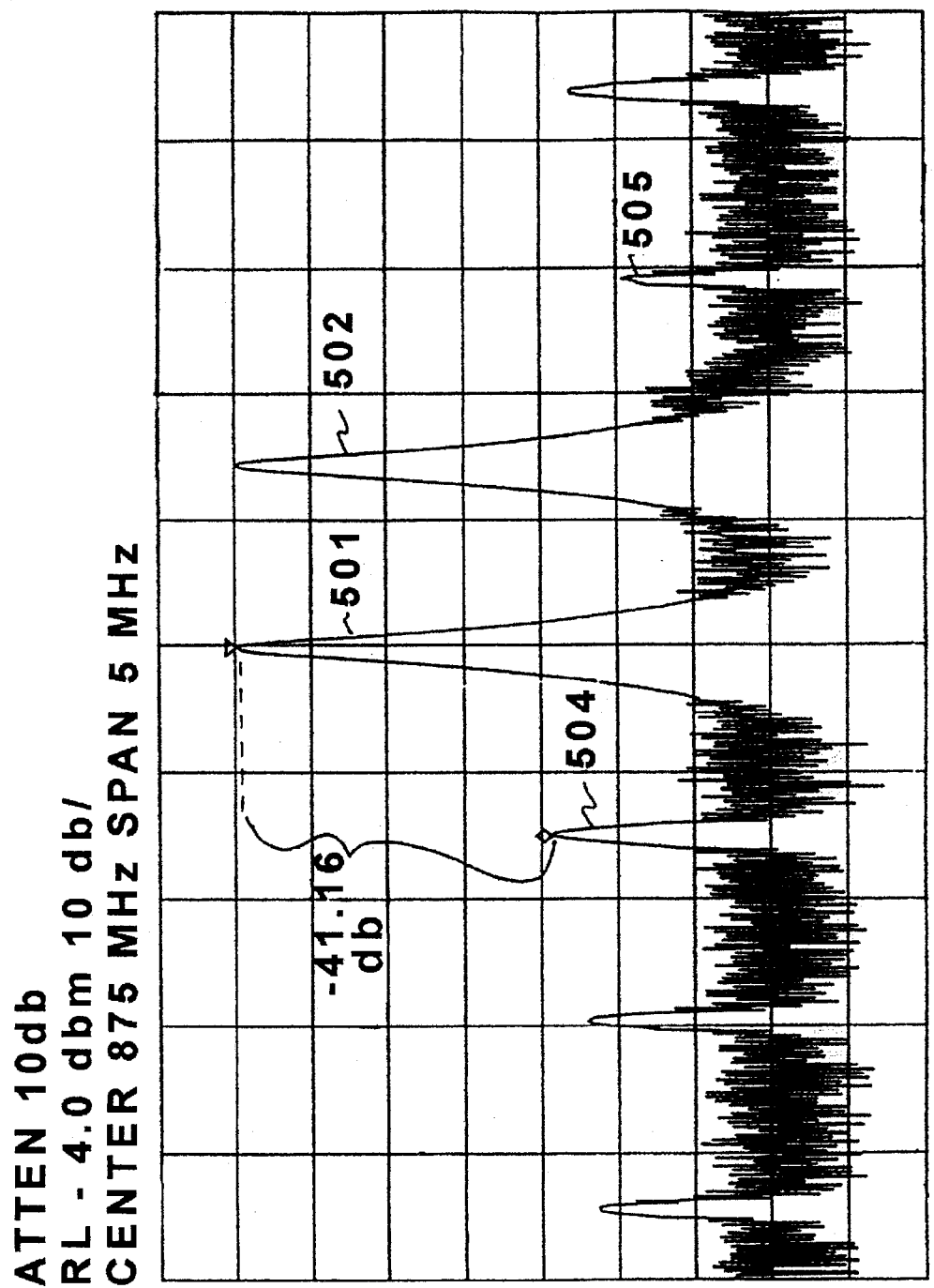
FIGS. 5A–5E are graphs illustrating the reduction of intermods in signals amplified according to the FIG. 3 amplification system by a comparison with signals amplified with a class AB amplifier.
Figure 5B:
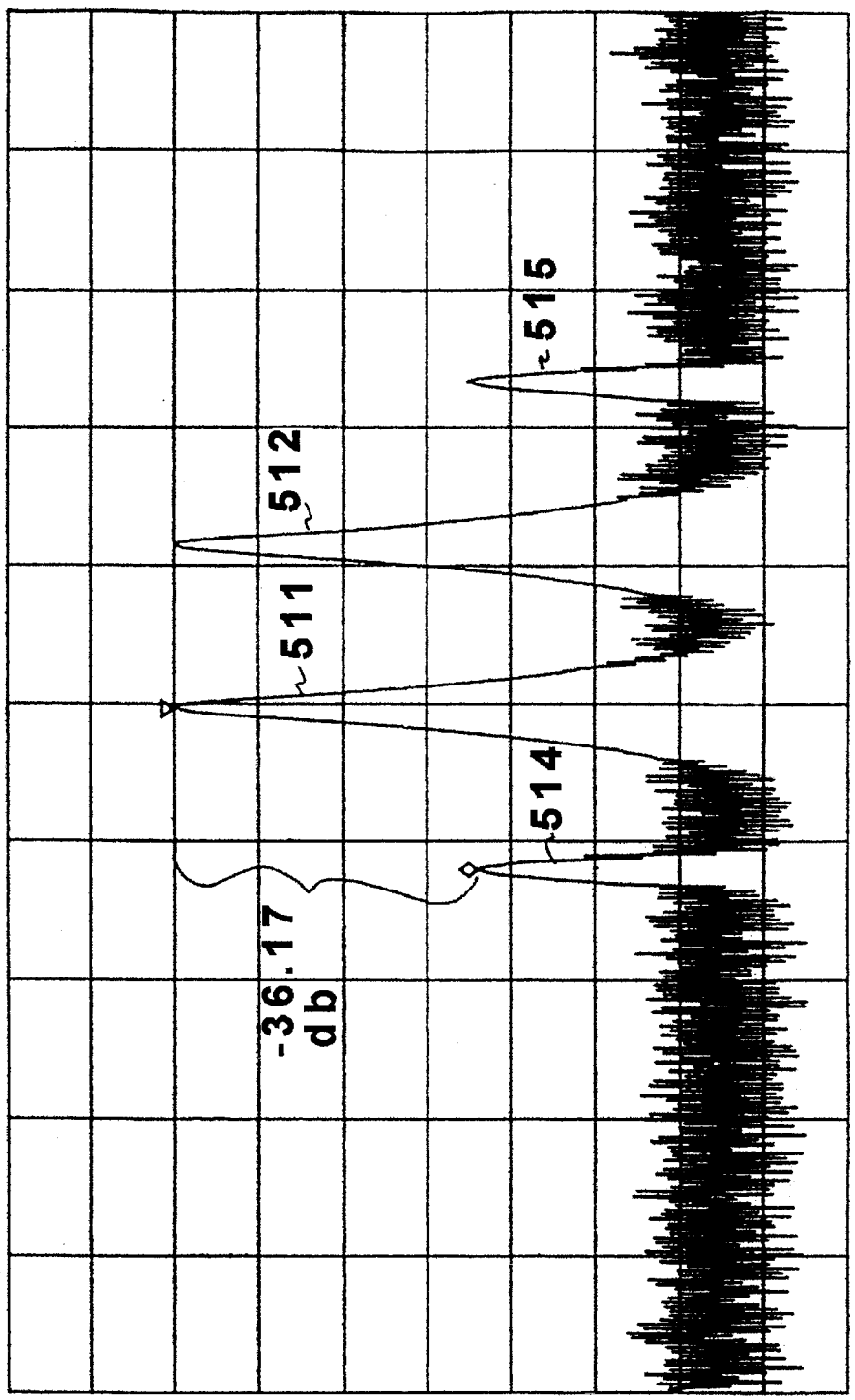
Figure 5C:
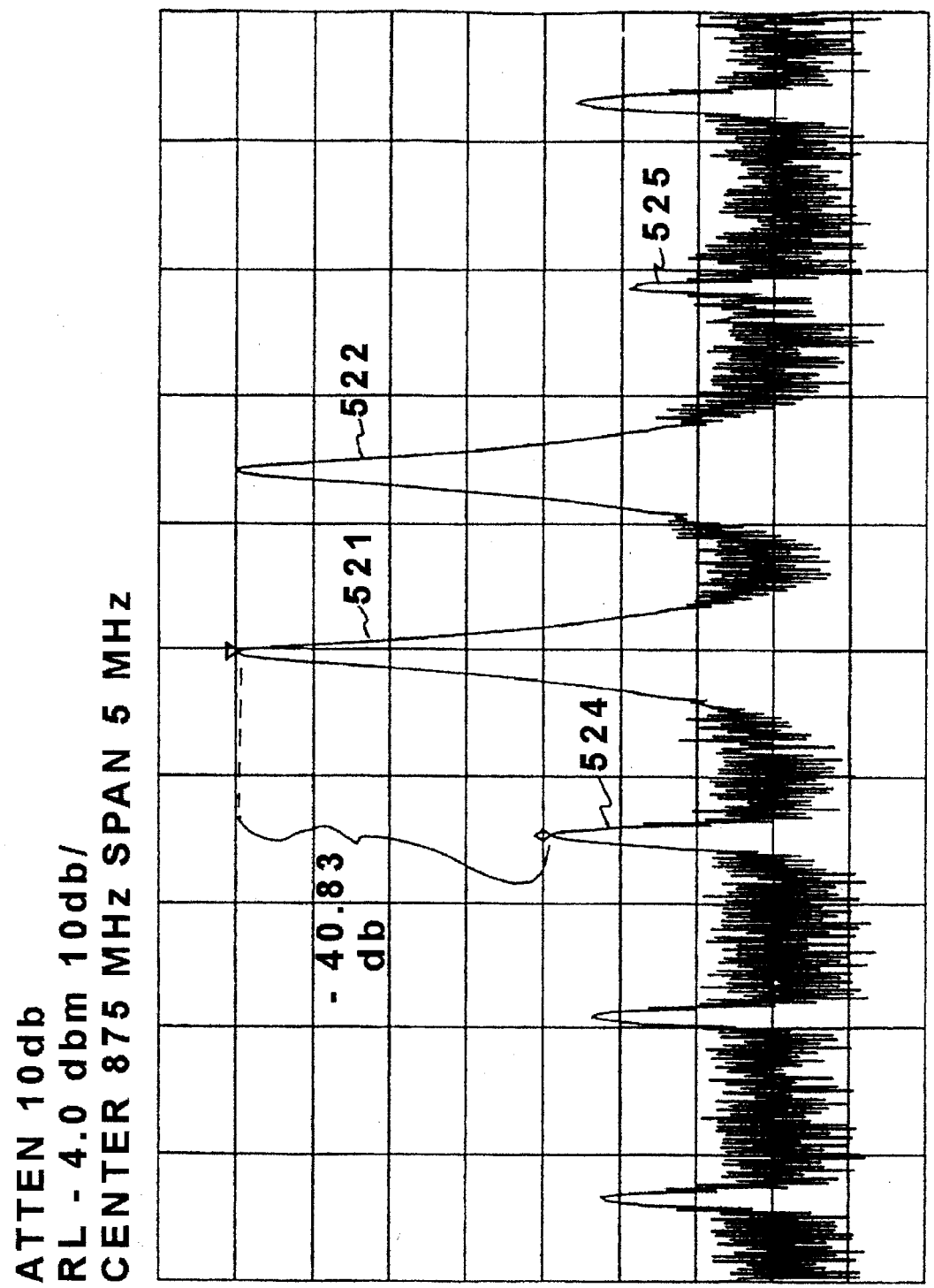
Figure 5D:
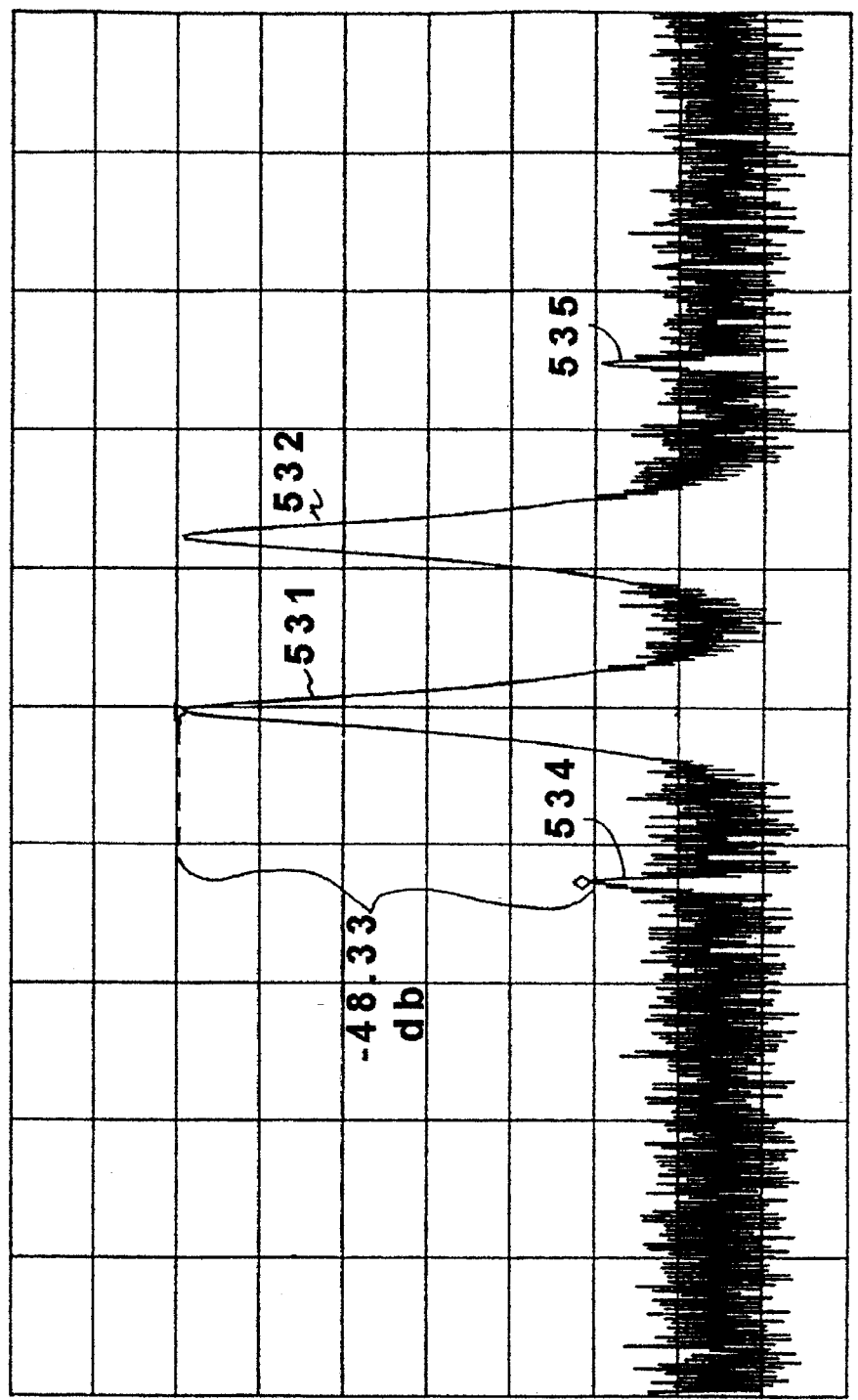
Figure 5E:
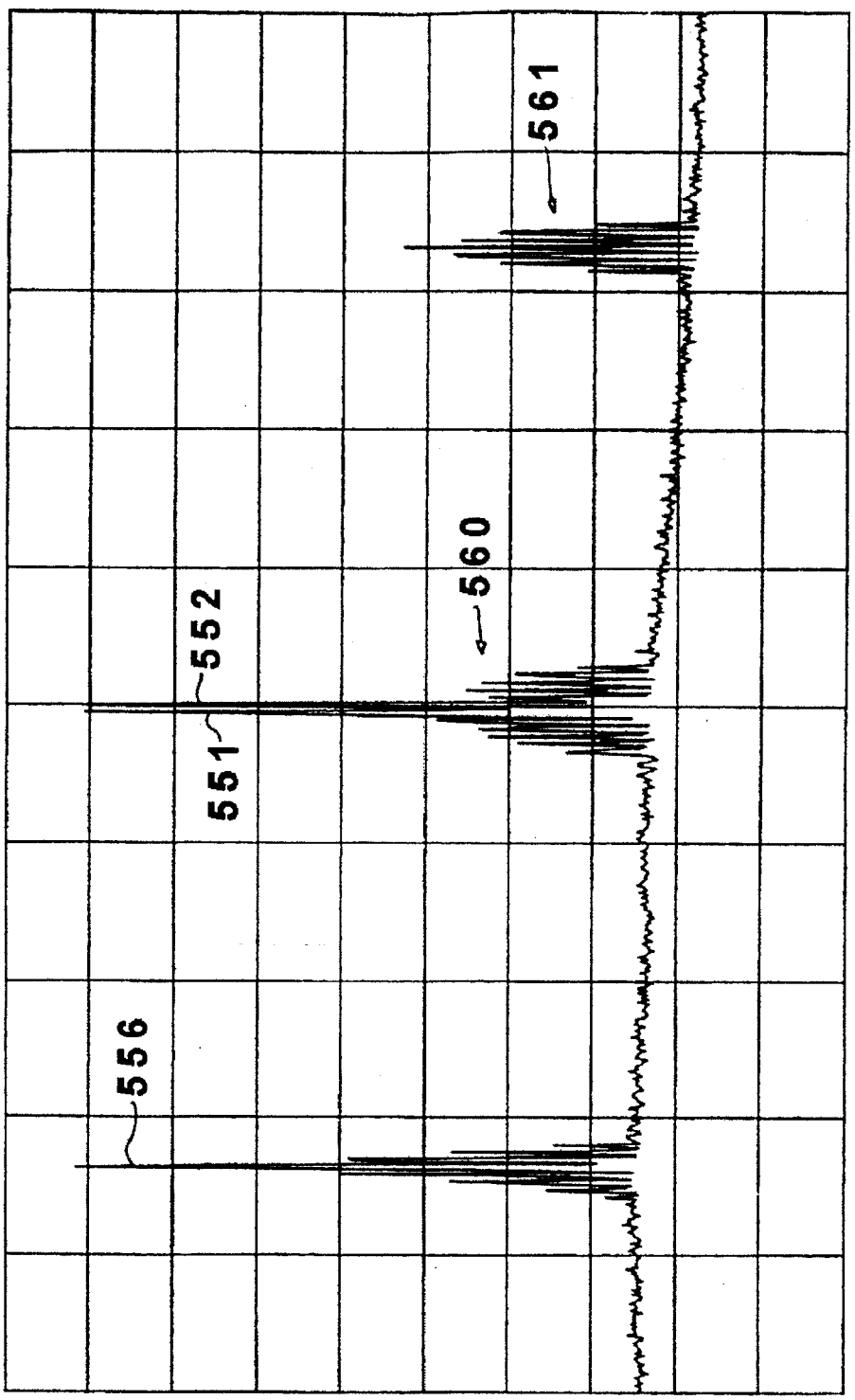

FIG. 5E is another graph showing output signals for an amplification system in accordance with the FIG. 3 embodiment. The FIG. 5E graph shows two primary tones 551, 552 centered at about 875 MHz in an amplified output signal 560. The FIG. 5E graph further shows a signal 556 corresponding to a sinusoidal or similar waveform generated by the tone generator 306 at a frequency of about 842 MHz. At about 908–918 MHz in the graph of FIG. 5E appear a spectral by-product 561 in the output, similar to what is shown in FIG. 65. Bandpass filter 315 is preferably configured so as to filter out the spectral by-product 561 and the tone signal 556, while passing the primary output signal 560.

Because of the higher order spectral by-products, a bandpass filter 315 is preferred over a high pass filter, but a high pass filter may work instead of a bandpass filter in situations where the spectral by-products are not significant enough to affect performance.

Bandpass filter 315 is preferably configured so as to have rejection characteristics of approximately 60 dB or more, and minimal loss (e.g., less than 1 dB). Although these are preferred characteristics, less rigid rejection and loss requirements may be suitable in applications where such requirements are not necessary.

FIGS. 5A–5D show in more detail the effect of the FIG. 3 amplification system on reducing spectral by-products such as third order intermods. FIG. 5A is a graph of an output of an exemplary nonlinear, class AB amplifier for a particular input signal, without application of the FIG. 3 amplification system. In FIG. 5A, the amplifier is assumed to operating in or near a saturation region. The FIG. 5A graph shows two primary tones 501, 502, as well as two third order intermods 504, 505 having a relative amplitude about 41.16 dB less than the two primary tones 501, 502.

FIG. 5B is a graph of an output of the same class AB amplifier as in FIG. 5A, but operating at a power level 10 dB less and therefore below the saturation region. The FIG. 5B graph shows two primary tones 511, 512, as well as two third order intermods 514, 515 having a relative amplitude about 36.17 dB less than the two primary tones 511, 512. Notably, as compared with the FIG. 5A graph, the relative size of the third order intermods 514, 515 has grown with respect to the size of the primary tones 511, 512, which is an undesirable effect. It may be expected that, as the operating power continues to decrease, the relative size of the third order intermods will continue to increase.

FIG. 5C is a graph of an output of the FIG. 3 amplification system for a particular input signal using an exemplary nonlinear, class AB amplifier as amplifier 312. In FIG. 5C, the amplifier 312 is assumed to operating in or near a saturation region. The FIG. 5C graph shows two primary tones 521, 522, as well as two third order intermods 524, 525 having a relative amplitude about 40.83 dB less than the two primary tones 521, 522. It can therefore be seen that the FIG. 3 amplification system provides slightly improved results when the amplifier is operating at or near the saturation region.

FIG. 5D is a graph of an output of the same exemplary amplification system in accordance with the embodiment shown in FIG. 3, but wherein the amplifier 312 operates at a power level 10 dB less and therefore below the saturation region. The FIG. 5D graph shows two primary tones 531, 532, as well as two third order intermods 534, 535 having a relative amplitude about 48.33 dB less than the two primary tones 531, 532. As compared with the FIG. 5B graph, the relative size of the third order intermods 534, 535 with respect to the size of the primary tones 531, 532 is substantially less than in the FIG. 5B graph, leading to substantially improved performance. Unlike a standard class AB amplifier, it may be expected with the FIG. 3 amplification system that, as the operating power continues to decrease, the relative size of the third order intermods will not increase but will in fact be reduced. Thus, while the FIG. 3 amplification system provides somewhat improved performance with respect to rejection of third order intermods when the amplifier operates at or near the saturation region, it provides substantially improved performance when operating below the saturation region.

FIGS. 7A–7D are graphs showing the effect on input-output power characteristics of a non-linear amplifier operating in accordance with the FIG. 3 amplification system.

Figure 7A:
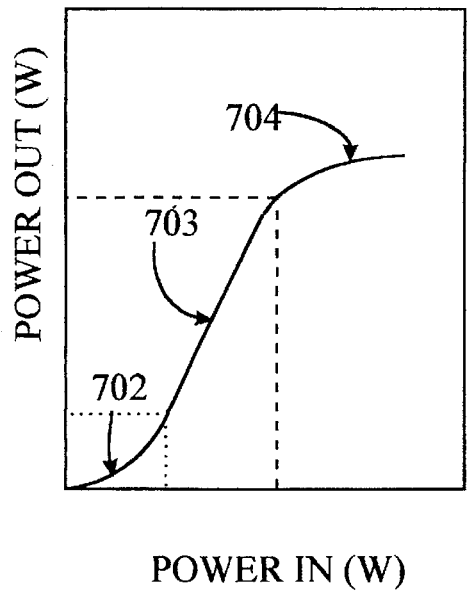
FIGS. 7A–7D are graphs showing the effect on input-output power characteristics of a non-linear amplifier operating in accordance with the FIG. 3 amplification system.
Figure 7B:
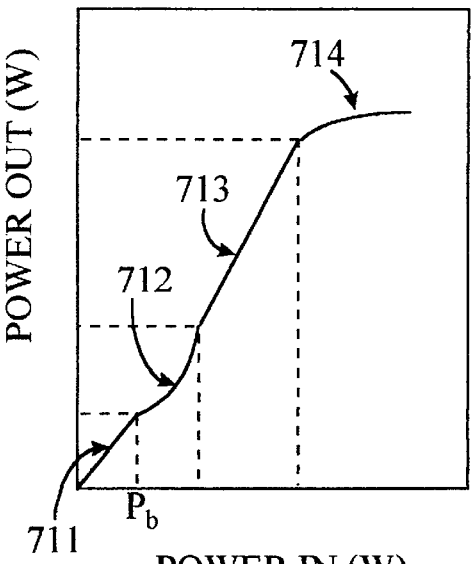
Figure 7C:
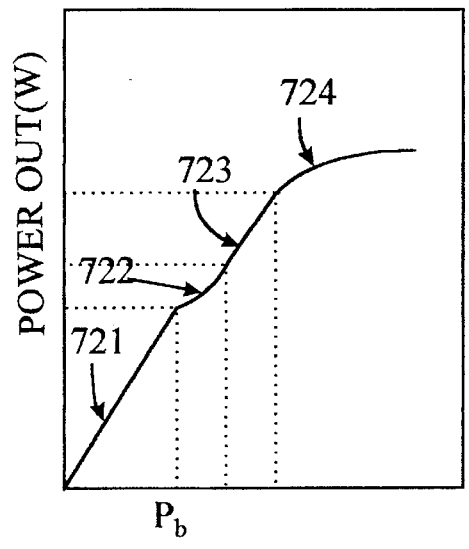
Figure 7D:
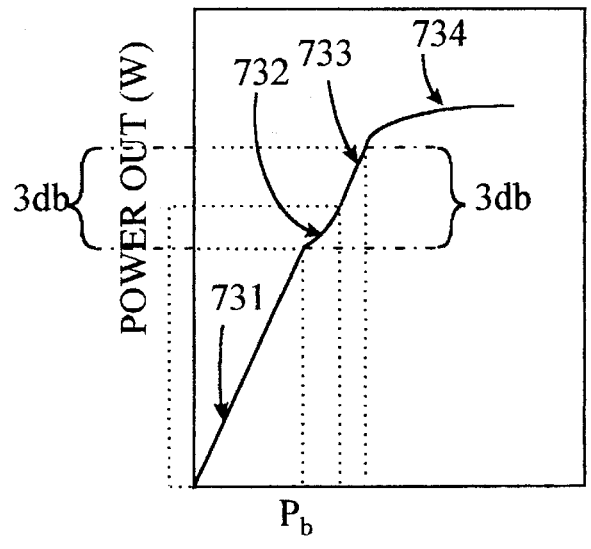

FIG. 7A is a graph similar to that of FIG. 2B, and shows an input-output power characteristic for an exemplary class AB amplifier. FIGS. 7B through 7D are graphs of exemplary input-output characteristics for particular embodiments in accordance with the FIG. 3 amplification system. FIG. 7B illustrates the effect of adding the tone signal 307 to the input of amplifier 312 in the manner shown in FIG. 3. In each of FIGS. 7B through 7D, an "effective linear region" is created in which the input signal 305 below a certain power level is amplified in a linear manner. The "non-linear" and "linear" regions are compressed above the effective linear region, and are reduced in size. The amount of compression depends upon selection of the tone signal 307.

FIG. 7B is a graph showing a tone bias point $P_B$ set relatively low, creating a relatively small effective linear region 711. The non-linear region 712 and linear region 713 of the amplifier are compressed to the region above the effective linear region 711 and below the saturation region 714. FIG. 7C is a graph showing a tone bias point $P_B$ set at a relatively median level, creating a relatively larger effective linear region 721. The non-linear region 722 and linear region 723 of the amplifier are compressed to the region above the effective linear region 721 and below the saturation region 724. The amount of compression in the graph of FIG. 7C is more than with the FIG. 7B graph.

Preferably, the effective linear region is made as large as possible, and the non-linear region of the amplifier compressed to the largest extent possible, without driving the amplifier into saturation. A preferred tone bias operating point is shown in the graph of FIG. 7D. In FIG. 7D, the tone bias point $P_B$ is set at a relatively high level, creating a relatively large effective linear region 731. The non-linear region 732 and linear region 733 of the amplifier are compressed to the region above the effective linear region 731 and below the saturation region 734. Preferably, the tone bias point $P_B$ is set so that the output power is approximately 3 dB below the saturation region (i.e., roughly half the power level of saturation).

A preferred tone bias point $P_B$ for a particular amplification system may be selected by trial and error by gradually increasing the strength of the tone signal 307 until the point of output power 3 dB below saturation is determined. Alternatively, the tone bias point $P_B$ may be determined from knowledge of the gain and the 1 dB compression point of the amplifier 312. For example, if the gain of the amplifier 312 is 30 dB, and the 1 dB compression point (i.e., the output 1 dB below the saturation level) is 40 dBm, then the input tone should be less than or equal to 40 dBm−30 dB=10 dBm. The tone bias point $P_B$ is preferably selected 3 dB less than the above calculated value, or at 10 dBm−3 dB=7 dBm. Thus, the input signal 305 will typically be less than 10 dBm, and the tone generator 306 will be configured to output a tone having an amplitude of +7 dBm at the tone frequency $f_B$.

Figure 8:
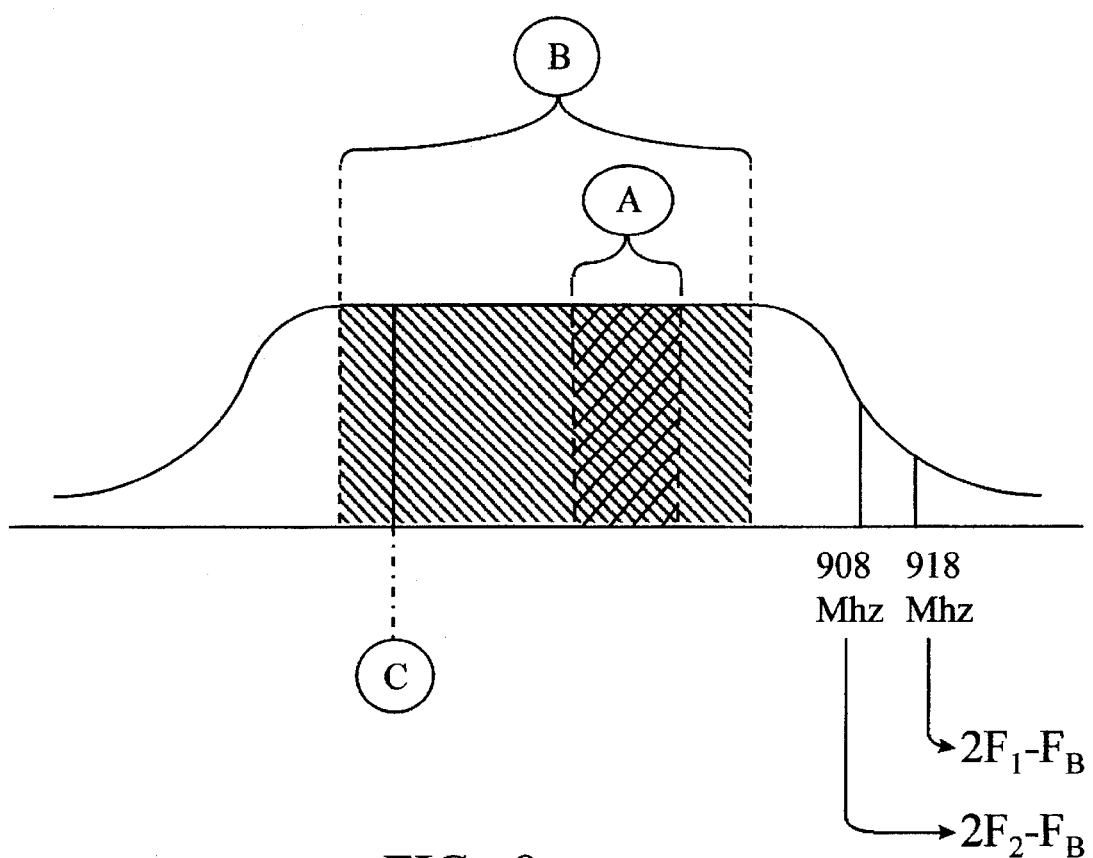
FIG. 8 is a frequency diagram showing selection of a tone frequency relative to bandpass regions of the amplifier.

The tone frequency $f_B$ is preferably selected so as to lie outside of the operating bandpass region of the amplifier 312. FIG. 8 is a frequency diagram illustrating selection of a tone frequency relative to certain bandpass regions associated with the amplifier 312. In FIG. 8 is shown an amplifier bandpass region B, over which is superimposed an operating bandpass region A of the amplifier 312 (i.e., the expected input frequency range). A tone frequency C is preferably selected so as to lie within the amplifier bandpass region B, but outside of the operating bandpass region A. The selected frequency C should be far enough away from the operating bandpass region A such that spectral by-products 810 (e.g., by-products at frequencies iB1 and iB2 shown in FIG. 6B) will be well outside of the operating bandpass region A.

Experiment has shown that the FIG. 3 amplification system may result in substantial power savings over a standard class A amplifier; e.g., power savings in the range of 30%–40% over class A amplifier may be expected, even considering the power drawn by the tone generator 306.

In a preferred embodiment, the amplification system of FIG. 3 may be deployed in a transmitter such as is suitable for carrying out over-air communications. The FIG. 3 amplification system may be particularly useful for transmitters with an output signal power in the range of 5 watts or more, and may be suitable for transmitters with an output signal power of several hundred watts or more.

Alternative Embodiments

The present invention has been set forth in the form of its preferred embodiments. It is nevertheless intended that modifications to the disclosed waveform generation techniques may be made by those skilled in the art without departing from the scope and spirit of the present invention. Moreover, such modifications are considered to be within the purview of the appended claims.

Figure 9:
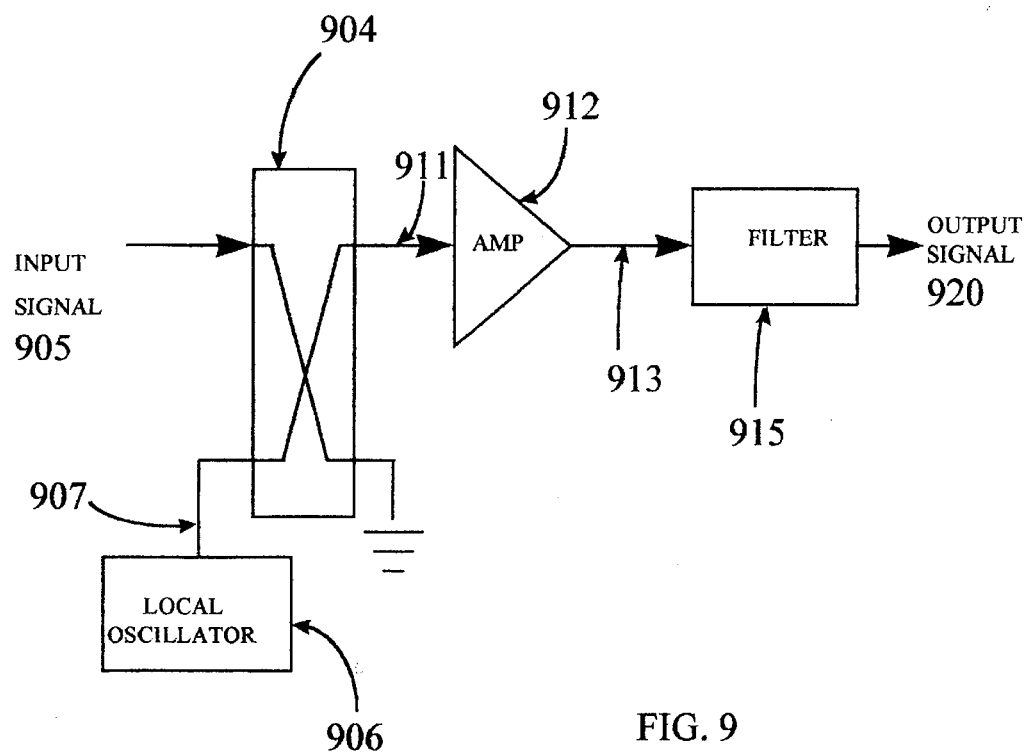
FIG. 9 is a block diagram of an alternative embodiment of the present invention.

FIG. 9 is a block diagram of an alternative embodiment of the present invention. The FIG. 9 embodiment comprises an amplifier 912, a tone generator 906, a four-port coupler 904, and a bandpass filter 915. An input signal 905 is connected to the four-port coupler 904. The tone generator 906, which may be embodied as a local oscillator, is also connected to the four-port coupler 904. The four-port coupler 904 combines the input signal 905 with a tone output signal 907 from the tone generator 906 and produces an amplifier input signal 911. The amplifier input signal 911 is connected to the amplifier 912 (preferably a non-linear amplifier), which amplifies the amplifier input signal 911 and generates an amplified signal 913. The amplified signal 913 is connected to the bandpass filter 915, which filters the amplified signal 913 and generates an output signal 920.

Principles of operation of the FIG. 9 embodiment are similar to the FIG. 3 embodiment, except that the tone signal 907 is connected to the amplifier 912 via the four-port coupler 904, rather than the input signal 305 of the FIG. 3 embodiment being connected to the amplifier 912.

Figure 10:
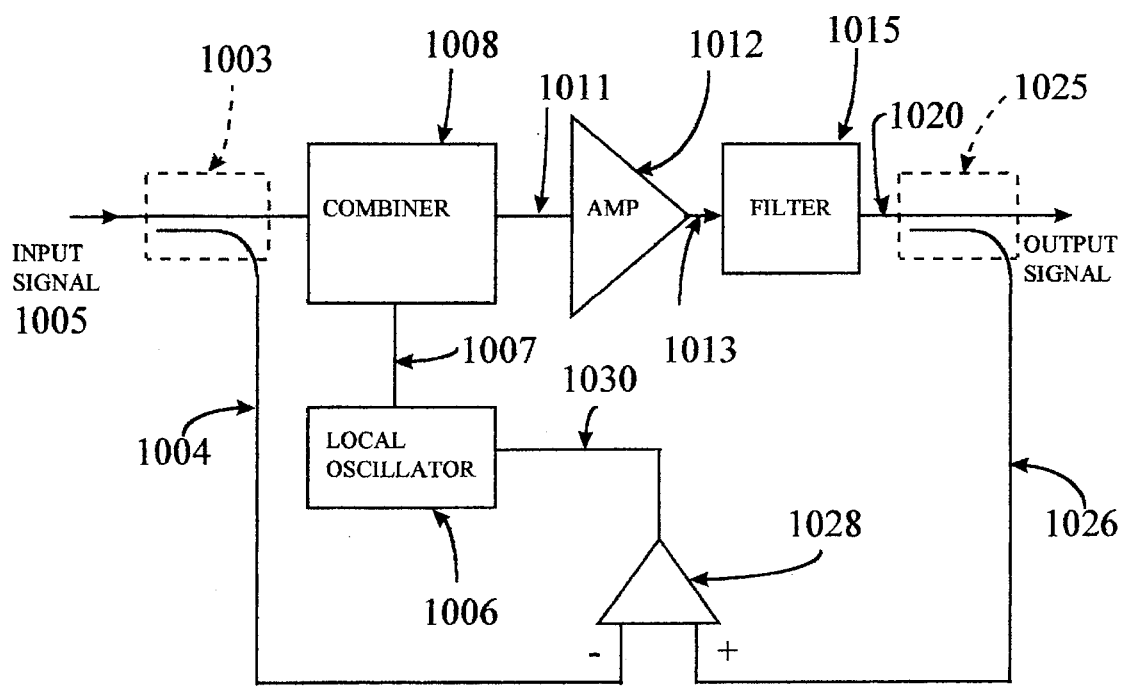
FIG. 10 is a block diagram of another alternative embodiment of the present invention, using feedback to control a local oscillator.

FIG. 10 is a block diagram of another alternative embodiment of the present invention, using feedback to control a local oscillator 1006. In the FIG. 10 embodiment, an input signal 1005 is connected to a coupler 1003 which is connected to a combiner 1008. The combiner is connected to an amplifier 1012 (preferably a non-linear amplifier). The amplifier 1012 is connected to a filter 1015. The filter 1015 produces an output signal 1020, which is connected to another coupler 1025. A tone generator 1006 (e.g., a local oscillator) generates a tone signal 1007 which is provided to the combiner 1008. A comparator 1028 compares the output 1004 from the coupler 1003 and the output 1026 from the other coupler 1026 and generates a comparison signal 1030 thereby. The comparison signal 1030 controls the amplitude of the local oscillator 1006.

In operation, the comparator 1028 is used to ensure that the amplifier 1012 remains in an "on" state even when the input signal is weak. Thus, if the output signal 1020 drops too low, the comparator signal 1030 causes the local oscillator 1006 to increase in amplitude. This in turn causes the amplifier 1012 to remain in the desired operating region. If the output signal 1020 is relatively high, then the comparator signal 1030 changes state so as to decrease the amplitude of the tone signal 1007, as the tone signal 1007 is then assumed to be not necessary for maintaining the amplifier 1012 in the desired operating region. The comparator 1028 monitors the input signal 1005 via coupler 1003 to ensure that a high signal level of the output signal 1020 is the result of the input signal 1005, and not the result of the tone signal 1007. Thus, if the amplitude of the input signal 1005 is low while the amplitude of the output signal 1020 is relatively high, the comparator signal 1030 will cause an increase in the amplitude of the local oscillator output in order to maintain the amplifier 1012 in the desired operating range.

A limiter (not shown) may be placed at the output of the comparator 1028 to ensure that the tone generated by the local oscillator 1006 does not exceed a predefined maximum tone signal amplitude.

Figure 11:
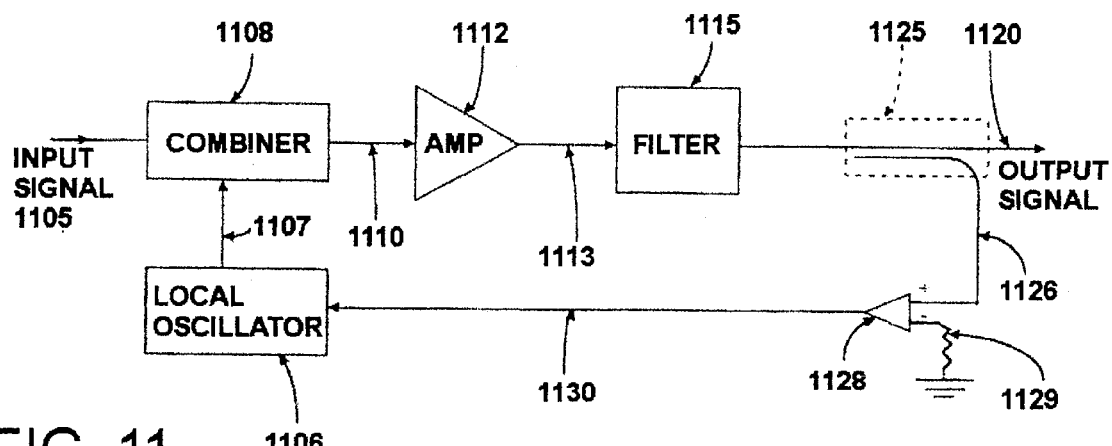
FIG. 11 is a block diagram of another alternative embodiment of the present invention, using an alternative feedback configuration to control the local oscillator.
Figure 12:
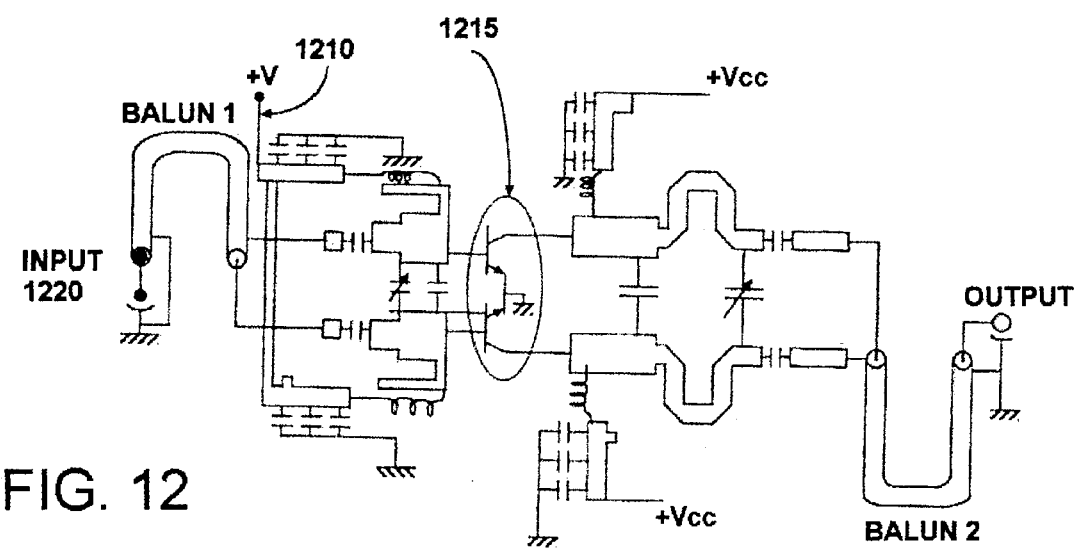
FIG. 12 is a block diagram of an amplifier configured with a DC bias signal as is generally known in the art.

FIG. 11 is a block diagram of another alternative embodiment of the present invention, using an alternative feedback configuration to control the local oscillator. The FIG. 11 embodiment comprises a combiner 1108, an amplifier 1112, a filter 1115, a coupler 1125, a comparator 1128, and a tone generator 1106 (e.g., a local oscillator). The FIG. 11 embodiment is similar to the FIG. 10 embodiment, except that the FIG. 11 embodiment does not utilize an additional coupler to monitor the input signal 1105. Monitoring of the input signal 1105 may not be necessary in some applications.

In other respects, the principles of the FIG. 3 embodiment apply also to the embodiments of FIGS. 10 and 11.

Figure 13:
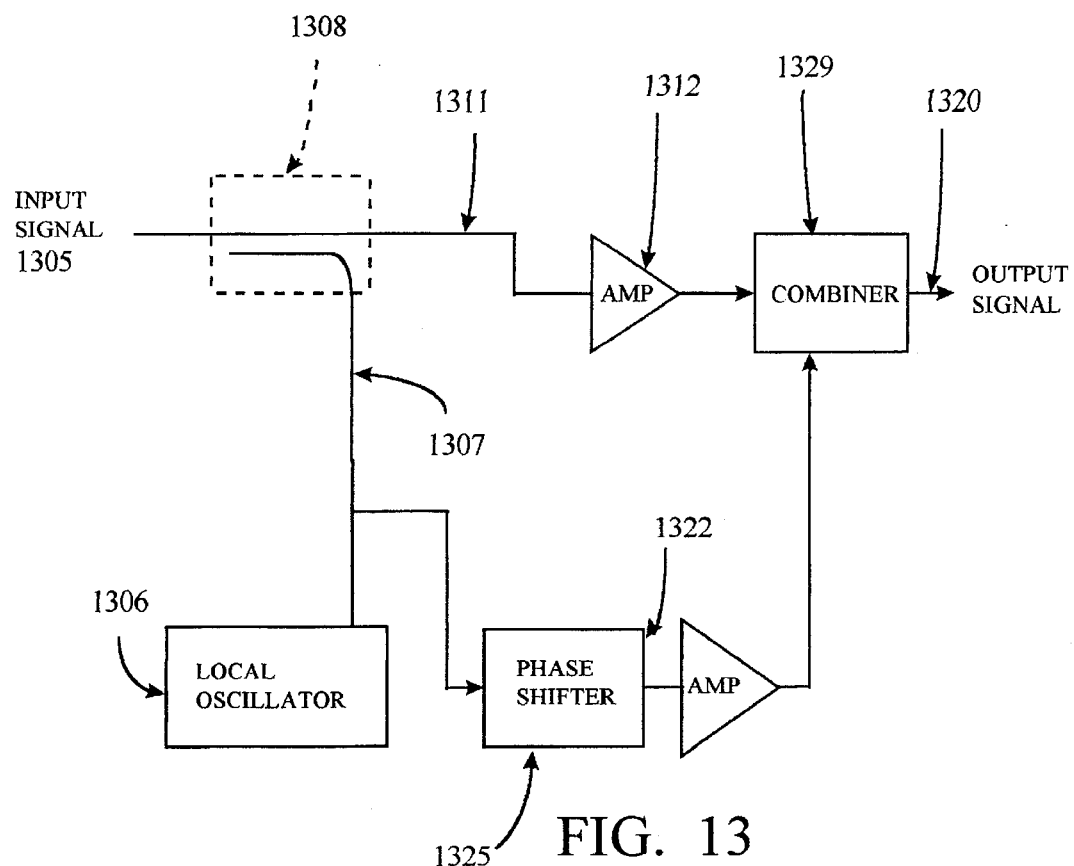
FIG. 13 is a diagram of an alternative embodiment of the present invention utilizing means other than a bandpass filter to eliminate intermods.

FIG. 13 is a diagram of an alternative embodiment of the present invention utilizing a phase shifting circuit rather than a bandpass filter to eliminate the tone signal from the output. The FIG. 13 embodiment comprises a coupler 1308 connected to an input signal 1305, a tone generator 1306 (e.g., local oscillator), and an amplifier 1312, configured in a manner to the FIG. 3 embodiment. The tone signal 1307 output from the tone generator 1306 is connected to a phase shifter 1325 (e.g., an inverter), which is connected to a second amplifier 1322 matched to the first amplifier 1312. Outputs from both of the amplifiers 1312, 1322 are connected to a combiner 1329, which combines its inputs and produces an output signal 1320. Rather than using a bandpass filter to eliminate the tone signal, the phase shifter 1325 inverts the tone signal 1307 and provides it to a matched amplifier 1322; the output of the matched amplifier 1322 is then combined with the output of the first amplifier 1312 in order to cancel the tone signal 1307 component output from the first amplifier 1312.

Figure 14:
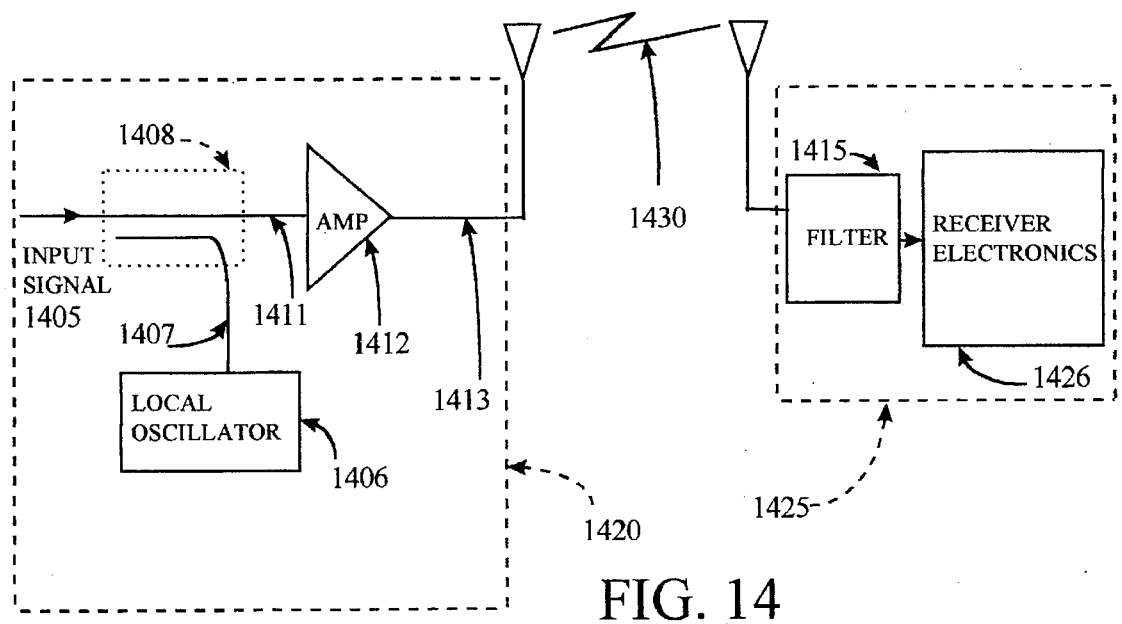
FIG. 14 is a diagram of an alternative embodiment wherein a bandpass filter is positioned at the opposite end of a communication link.

FIG. 14 is a diagram of an alternative embodiment wherein a bandpass filter is positioned at an opposite end of a communication link. The FIG. 14 embodiment comprises the same general components as the FIG. 3 embodiment (or any of the other similar embodiments). A transmitter 1420 communicates with a receiver 1425 over a communication link 1430. The transmitter 1420 comprises a coupler 1408, a tone generator 1406 (e.g., a local oscillator), and an amplifier 1412 (preferably non-linear), similar to the FIG. 3 embodiment. The amplifier output signal 1413 is transmitted over the communication link 1430 (e.g., an over-the-air communication channel) to the receiver 1425. The receiver 1425 comprises a bandpass filter 1415 and other receiver electronics 1426 as desired for the particular application. The FIG. 14 embodiment operates according to the same principles as the FIG. 3 embodiment, except that filtering of the tone signal is carried out at the receiver 1425.

Figure 15:
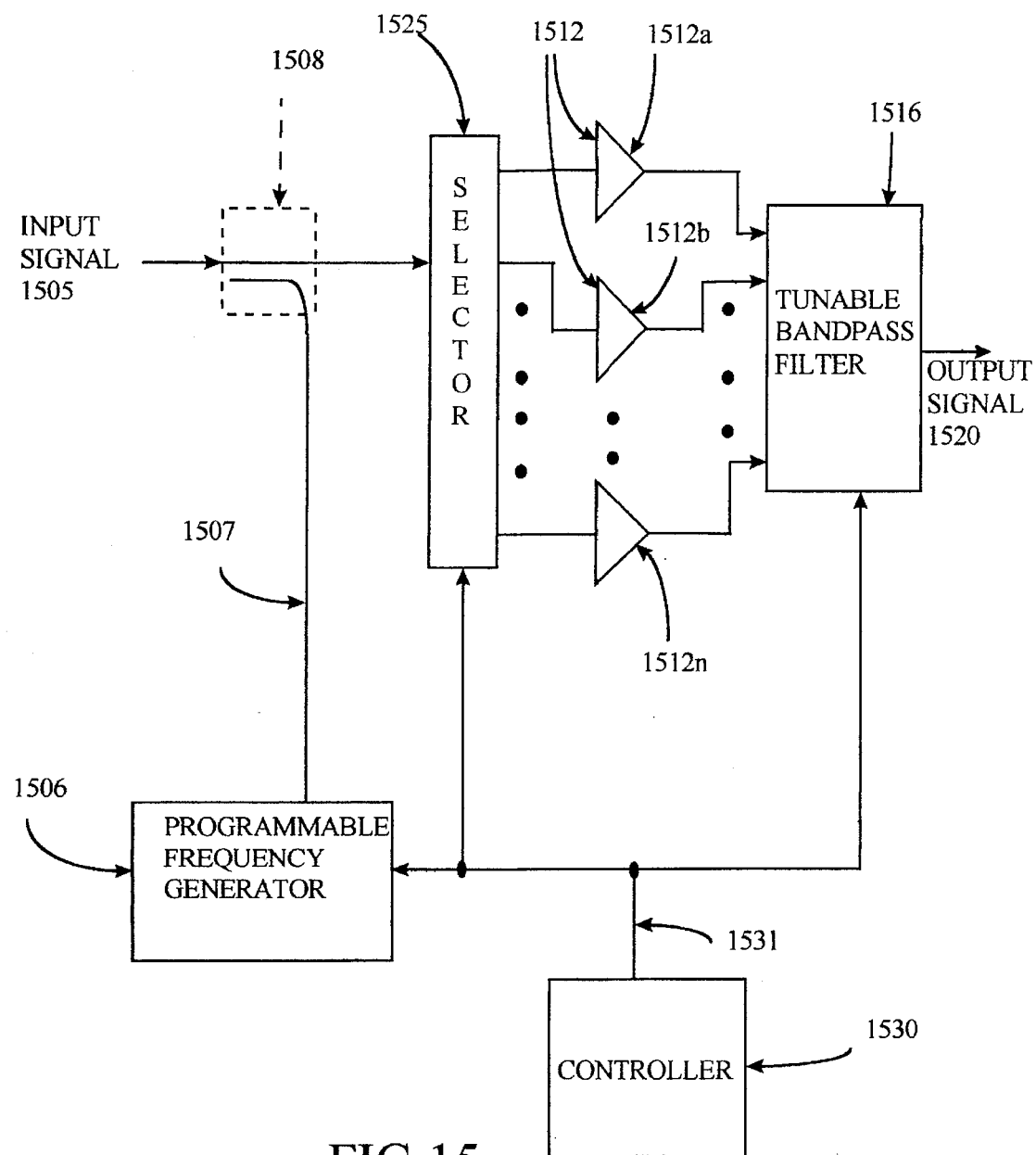
FIG. 15 is a diagram of an embodiment of the invention having a plurality of amplifiers and a programmable frequency generator to allow operation over different frequency bands.

In another alternative embodiment, the tone generator 306 may comprise a selectable frequency generator (e.g., a frequency synthesizer) under control of a controller which selects the tone frequency according to an operating frequency band of the input signal. A block diagram of this embodiment is shown in FIG. 15. The FIG. 15 embodiment comprises a controller 1530 outputting control lines 1531 to a programmable frequency synthesizer 1506, a multiplexer 1522, and a tunable bandpass filter 1515. According to an operating frequency band of the input signal 1505, the controller 1530 selects a tone frequency for the tone signal 1507 output from the programmable frequency synthesizer 1506. A plurality of amplifiers 1512a, 1512b, ... 1512n are each optimized to one or more of the operating frequency bands of the input signal 1505. The coupler 1508 combines the input signal 1505 with the selected tone signal 1507, and provides an output to a selector 1525. The selector 1525, in response to control lines 1531 from the controller 1530, selectively connects the coupler output to the appropriate amplifier 1512. The amplifiers 1512a, 1512b, ... 1512n are each connected to a tunable bandpass filter 1515. In response to the control lines 1531 from the controller 1530, an appropriate bandpass filtering range is selected for the tunable bandpass filter 1515.

In an exemplary manner of operation, it may be desired to transmit an input signal 1505 centered at one of a plurality of frequencies (i.e., f1, f2 ... fn), such as in a communication system wherein signals among multiple communication points are distinguished according to frequency of the transmitted signal. The FIG. 15 apparatus may be embodied in a transmitter, and the controller 1530 configured to select the appropriate signal path and component operating ranges so as to optimally amplify and transmit the input signal 1505. Thus, the controller selects (via the selector 1525) the amplifier 1512 having the appropriate operating range, and matches the tone signal 1507 and the bandpass filter range of the tunable bandpass filter 1515 for optimal operation with the selected amplifier 1512 and input signal frequency.

Although the tone generator shown in various embodiments (e.g., tone generator 306 in FIG. 3) has been described as preferably outputting a single tone, multiple tones may be generated by the tone generator 306 while still remaining within the principles of the invention. However, generation of a single tone is preferred in order to keep the number of intermods and other spectral by-products to a minimum.

While preferred embodiments have been described herein with respect to a transmitter utilizing a tone generator, the principles of the present invention are not limited to transmitters, and may be used in a receiver, or in any application requiring amplification of electrical signals.

Other modifications and variations will be apparent to those skilled in the art, and it is understood that the scope of the invention is not to be limited by the specific embodiments disclosed herein, but only by the appended claims.

What is claimed is:

1. Apparatus for amplifying an input signal, comprising
   a coupler connected to an input signal,
   a tone generator connected to said coupler, said tone generator outputting a tone signal having a center frequency outside the bandwidth of said input signal,
   a nonlinear amplifier connected to an output of said coupler, said nonlinear amplifier having an effective linear region determined by said tone signal, and
   a filter connected to an output of said nonlinear amplifier.

2. The apparatus of claim 1 wherein said nonlinear amplifier comprises a class C amplifier.

3. The apparatus of claim 1 wherein said nonlinear amplifier comprises a class AB amplifier.

4. The apparatus of claim 1 wherein said input signal comprises a time-varying signal.

5. The apparatus of claim 1 wherein said tone signal comprises a sinusoidal waveform.

6. The apparatus of claim 1 wherein said filter passes signals having a frequency within the bandwidth of said input signal, and attenuates intermods generated by an interaction of said tone signal and said input signal.

7. The apparatus of claim 6 wherein said filter also attenuates said tone signal.

8. The apparatus of claim 1 further comprising a second coupler connected to an output of said filter, and a comparator connected to said second coupler, said comparator having an output connected to said tone generator.

9. Apparatus for amplifying an input signal, comprising
   a coupler connected to an input signal,
   a tone generator connected to said coupler, said tone generator outputting a tone signal having a center frequency outside the bandwidth of said input signal,
   a nonlinear amplifier connected to an output of said coupler,
   a filter connected to an output of said nonlinear amplifier, and
   a second coupler connected to an output of said filter, and a comparator connected to said second coupler, said comparator having an output connected to said tone generator,
   wherein said comparator causes an amplitude of said tone signal to increase in response to a decrease in an amplitude of said nonlinear amplifier output, and to decrease in response to an increase in an amplitude of said nonlinear amplifier output.

10. The apparatus of claim 1 wherein said nonlinear amplifier is located in a transmitter and said filter is located in a receiver, said transmitter and receiver being separated by a communication link.

11. A method for amplifying an input signal, comprising the steps of
    receiving an input signal,
    generating a tone signal,
    combining said input signal with said tone signal, thereby generating a combined signal,
    amplifying said combined signal with a nonlinear amplifier, said combined signal linearizing the operating region of said nonlinear amplifier, and generating an output signal thereby, and
    bandpass filtering said output signal to remove said tone signal.

12. The method of claim 11 wherein said nonlinear amplifier comprises a class C amplifier.

13. The method of claim 11 wherein said nonlinear amplifier comprises a class AB amplifier.

14. The method of claim 11 wherein said tone signal comprises a sinusoidal waveform.

15. The method of claim 11 wherein said step of bandpass filtering said output signal further comprises the step of passing signals having a frequency within the bandwidth of said input signal, and attenuating intermods generated by an interaction of said tone signal and said input signal.

16. A method for amplifying an input signal, comprising the steps of receiving an input signal, generating a tone signal, combining said input signal with said tone signal, thereby generating a combined signal, amplifying said combined signal with a nonlinear amplifier, said combined signal causing said nonlinear amplifier to operate in an effective linear region, and generating an output signal thereby, bandpass filtering said output signal to remove said tone signal, and monitoring said output signal and adjusting an amplitude of said tone signal in response thereto.

17. The method of claim 16 further comprising the step of monitoring an amplitude of said input signal and adjusting said tone signal amplitude in response thereto.

18. The method of claim 16 wherein said step of monitoring said output signal and adjusting an amplitude of said tone signal in response thereto comprises the step of increasing said tone signal amplitude when said output signal is low, and decreasing said tone signal when said output signal is high.

19. An apparatus for amplifying an input signal comprising a local oscillator having as an output a sine wave centered at a predefined tone frequency, combining means coupling said sine wave and an input signal, a nonlinear amplifier connected to an output of said combining means, said nonlinear amplifier operating in an effective linear region having a range determined by said predefined tone frequency, and a bandpass filter connected to an output of said nonlinear amplifier, said bandpass filter configured to pass signals within a bandwidth of said input signal, and attenuate signals at said predefined tone frequency.

\* \* \* \* \*